United States Patent
Wang

(10) Patent No.: US 9,459,524 B2
(45) Date of Patent: Oct. 4, 2016

(54) MASK PLATE AND METHOD OF PATTERNING USING THE MASK PLATE

(71) Applicants: BOE TECHNOLOGY GROUP CO., LTD., Beijing (CN); BEIJING BOE DISPLAY TECHNOLOGY CO., LTD., Beijing (CN)

(72) Inventor: Dong Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 162 days.

(21) Appl. No.: 14/525,156

(22) Filed: Oct. 27, 2014

(65) Prior Publication Data

US 2015/0362833 A1    Dec. 17, 2015

(30) Foreign Application Priority Data

Jun. 11, 2014    (CN) .......................... 2014 1 0259177

(51) Int. Cl.
*G03F 1/50*    (2012.01)

(52) U.S. Cl.
CPC ...................................... *G03F 1/50* (2013.01)

(58) Field of Classification Search
CPC .......................................................... G03F 1/50
USPC .............................................................. 430/5
See application file for complete search history.

(56) References Cited

U.S. PATENT DOCUMENTS 9,022,564 B2 *    5/2015    Watanabe .............. G02B 27/22
                                                                348/54

* cited by examiner

*Primary Examiner* — Christopher Young
(74) *Attorney, Agent, or Firm* — Blakely Sokoloff Taylor & Zafman LLP

(57) ABSTRACT

The embodiment of the present invention provides a mask plate and a method of patterning using the mask plate, the mask plate comprising a light shielding area and an opening area, the edge of the opening area being in a concave-convex shape. The embodiment of the present invention, by setting the edge of the opening area of the mask plate in a concave-convex shape, can improve linearity of the matrix edge formed after the processes of coating, exposing, developing, roasting of the photoresist, so as to prevent the problem of generating a jagged or a wavy shape at the matrix edge of a color filter in a color film substrate, thereby improving uniformity of color display of a liquid crystal display. The effect is particularly significant for a product using a negative photoresist or with a relatively thin line width in the formed matrix.

10 Claims, 3 Drawing Sheets

MASK PLATE AND METHOD OF PATTERNING USING THE MASK PLATE

RELATED APPLICATIONS

The present application claims the benefit of Chinese Patent Application No. 201410259177.3, filed Jun. 11, 2014, the entire disclosure of which is incorporated herein by reference.

FIELD OF THE INVENTION

The present invention relates to the display field, in particular to a mask plate and a method of patterning using the mask plate.

BACKGROUND OF THE INVENTION

The liquid crystal display, by right of its characteristics such as low power consumption, relatively low manufacture cost and free of radiation etc., has become the mainstream of the flat panel display and has been widely used in electronic devices such as mobile phones, computers, televisions etc.

The main structure of the liquid crystal display comprises an array substrate formed by box aligning, a color film substrate and a liquid crystal layer located between the array substrate and the color film substrate. Its principle is controlling torsion of liquid crystal molecules in the liquid crystal layer through an electric field so as to control light transmittance of the liquid crystal layer; moreover, a black matrix (BM) and a color layer matrix (RGB) are formed on the color film substrate, which implement the functions of light shielding and light filtering respectively. During the process of manufacturing the liquid crystal display, the black matrix (BM), the color layer matrix (RGB) and a pillar spacer (PS) on the color film substrate generally adopt negative photoresists and are formed through processes such as coating, proximity exposing, developing, roasting etc. Specifically, referring to FIG. 1 and FIG. 2, in the proximity exposure process, the exposure light passes through the opening area of a mask plate 1' and irradiates a surface of a negative photoresist 2' on a substrate 3', a polymerization reaction will occur in the photoresist area that contacts the light to form a macromolecular chain with high intensity, then a matrix 21' will be formed on the surface of the substrate 3' after the processes of developing and roasting, while the photoresist area that does not contact the light will be dissolved or peeled off in the development process. However, in the exposure process, referring to FIG. 3 and FIG. 4, the mask plate comprises a light shielding area 11' and an opening area 12', the edge of the opening area 12' in the mask plate is in a linear shape; when the exposure light passes through the opening area 12' of the mask plate, due to the diffraction of the light source, there is a difference between the light intensities to which opening areas of different mask plates correspond, particularly at the edge of the opening area, the light intensity to which it corresponds is relatively low (the smaller the line width of the opening area is, the more obvious such a difference is), thereby influencing the surface hardening effect of the negative photoresist at the edge of the opening area. In the subsequent development process, the photoresist at the edge of the opening area absorbs water and expands, the stress increases, lateral deformation is easily produced, which results in bending of the edge of the matrix 21' (as shown in FIG. 5), thereby enabling the matrix edge of the color filter in the color film substrate to generate a jagged or a wavy shape rather than the desired linear type, resulting in badness (such as nonuniformity of color display of the subsequently formed display). Particularly in the process of forming a black matrix (BM) with a line width less than 10 μm, such a phenomenon is more obvious.

SUMMARY OF THE INVENTION

Therefore, it is desired to provide a mask plate and a method of patterning using the mask plate, which mask plate and method can improve linearity of the edge of the matrix formed by photoresist.

In order to achieve the above purpose, the solution of the embodiment of the present invention provides a mask plate comprising a light shielding area and an opening area, wherein the edge of the opening area is in a concave-convex shape.

Further, the concave-convex shape may be a jagged or a wavy shape.

Further, the concave-convex shape may be formed by a plurality of convexes, and the spacing between any two convexes on the same edge is the same.

Further, the plurality of convexes may be isosceles triangles and have the same size.

Further, the vertex angle of the convex may be 30°~150°.

Further, the height of the convex may be 1 μm to 2 μm, the width of the convex may be 1 μm to 8 μm.

Further, the convexes on two edges of the opening area may be oppositely arranged in one-to-one correspondence.

Further, the distance between any two opposite convexes on the two edges of the opening area may be 4 μm to 50 μm.

In order to achieve the above purpose, the embodiment of the present invention further provides a method of patterning using any of the above mask plates, comprising:
  forming a photoresist layer on a substrate;
  exposing the photoresist layer using the mask plate, and forming a photoresist matrix after development.

Further, the photoresist in the photoresist layer may be a negative photoresist.

The embodiment of the present invention, by setting the edge of the opening area of the mask plate in a concave-convex shape, can improve linearity of the matrix edge formed after the processes of coating, exposing, developing, roasting of the photoresist, so as to prevent the problem of generating a jagged or a wavy shape at the matrix edge of a color filter in a color film substrate, thereby improving uniformity of color display of a liquid crystal display. The effect is particularly significant for a product using a negative photoresist or with a relatively thin line width in the formed matrix.

DETAILED DESCRIPTION OF THE INVENTION

The present invention will be described below in more detail in combination with the drawings and the embodiments. The following embodiments are used for explanation of the present invention, not for limitation of the scope of the present invention.

Figure 1:
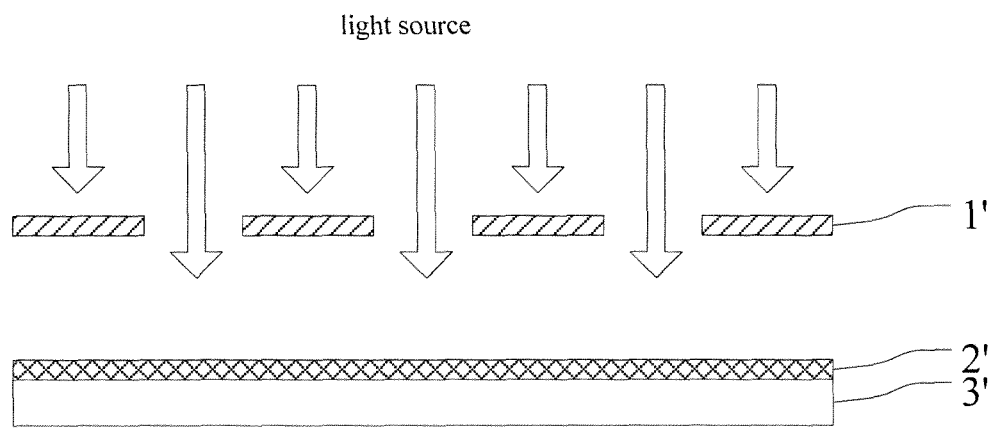
FIGS. 1~2 are schematic views of exposure and development of a negative photoresist in the prior art.
Figure 2:
Figure 3:
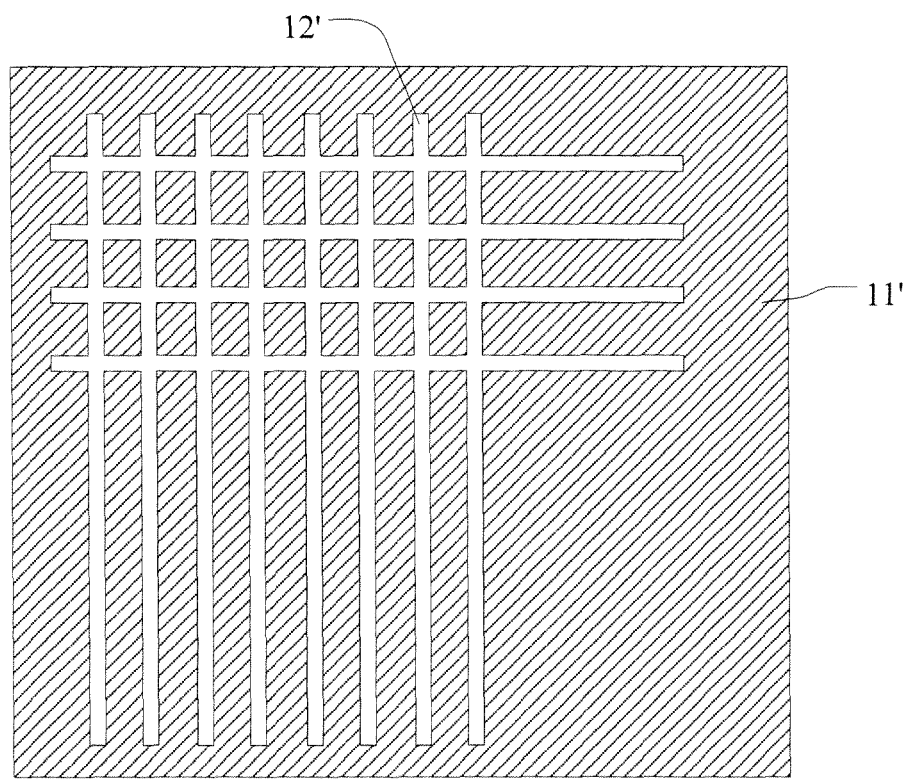
FIG. 3 is a schematic view of a mask plate in the prior art.
Figure 4:
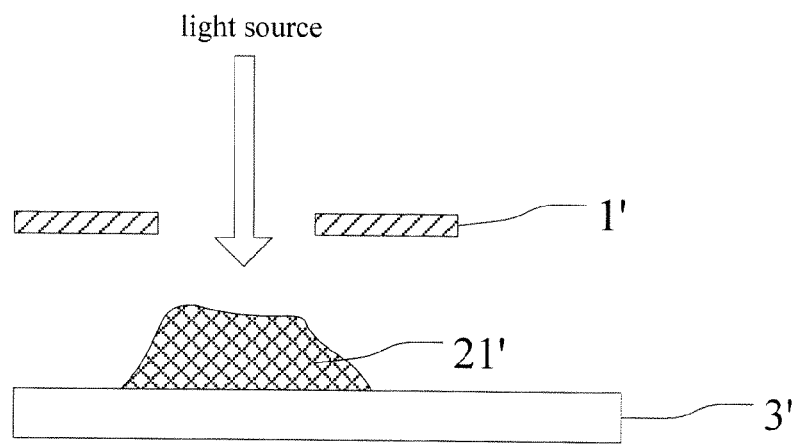
FIGS. 4~5 are schematic views of a negative photoresist matrix formed in the prior art.
Figure 5:
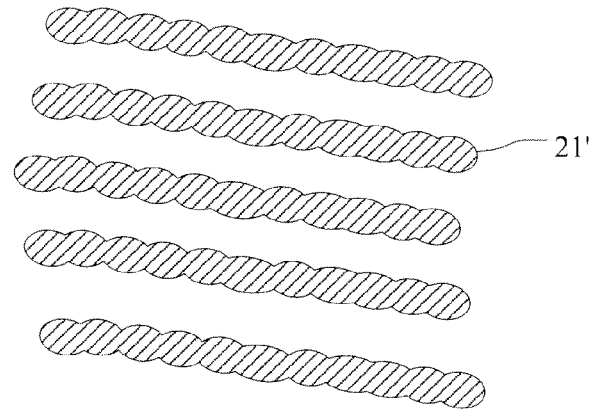
Figure 6:
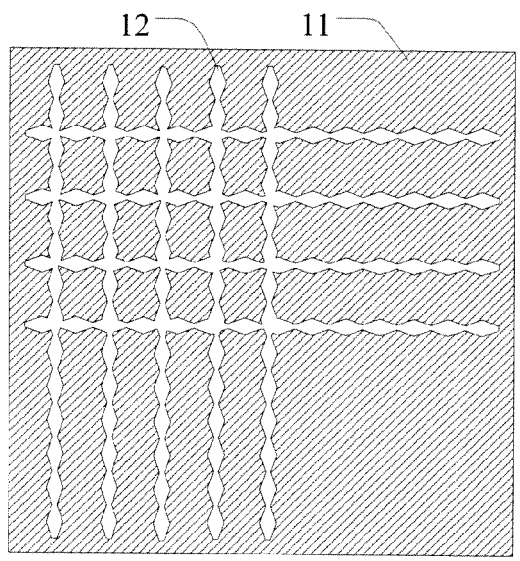
FIG. 6 is a schematic view of a mask plate provided by an embodiment of the present invention.

FIG. 6 is a schematic view of a mask plate provided by an embodiment of the present invention. The mask plate comprises a light shielding area 11 and an opening area 12, the edge of the opening area 12 being in a concave-convex shape.

Figure 7:
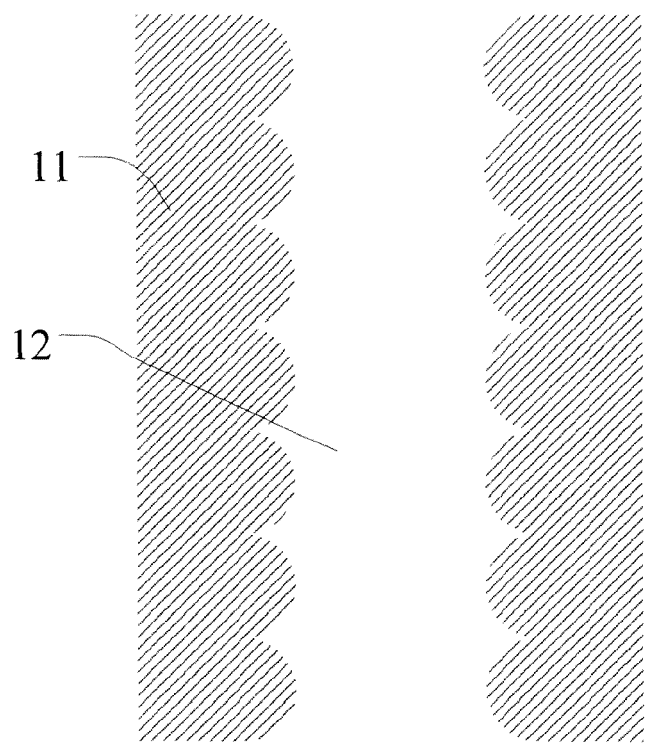
FIG. 7 is a schematic view of an opening area provided by an embodiment of the present invention.
Figure 8:
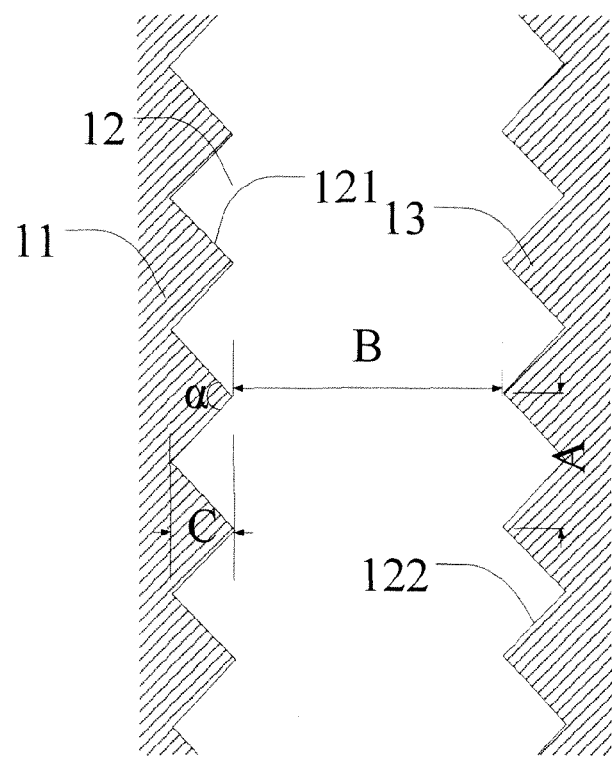
FIG. 8 is a schematic view of another opening area provided by an embodiment of the present invention.

The inventor realizes that refraction causes the whole light intensity at the edge of the opening area of the mask plate to be low (relative to the middle area of the opening area of the mask plate); this results in a relatively bad surface hardening effect of the negative photoresist to which the edge of the opening area of the mask plate corresponds; in the development process, it is easy for the photoresist matrix to absorb developing liquid (or, water), which may result in expansion of the photoresist matrix; the expansion of the photoresist matrix may further result in increase of the stress; since the photoresist matrix is attached on the surface of the substrate, such an increase of stress will be limited by the adhesive force between the photoresist matrix and the substrate. Such an increase of stress should be reduced as far as possible; hence, a concave-convex shape is formed at the edge of the opening area, such that the stress at the convex position is relatively strong while the stress at the concave position is relatively small, thereby achieving an overall stress balance.

Wherein the above concave-convex shape may be a wavy shape as shown in FIG. 7, and may also be a jagged shape as shown in FIG. 8.

Specifically, the above concave-convex edge can be formed by forming a plurality of convexes or a plurality of concave structures at the edge of the opening area 12. Referring to FIG. 8, the edge of the above opening area 12 is formed by a plurality of convexes 13; on the same edge, the spacing between any two adjacent convexes may be the same; for example, the distance between two adjacent convexes at the same edge is 1 µm, 2 µm and so on.

Preferably, the shapes of the plurality of convexes on the edge of the opening area may be set as isosceles triangles with the same size. Wherein the vertex angle α of the convex 13 (an isosceles triangle) may be 30°~150°, e.g., 60°, 90°, 120° etc.

Preferably, the height C of the convex is 1 µm to 2 µm, e.g., it may be 1.3 µm, 1.5 µm, 1.8 µm etc.; the width A of the convex is 1 µm to 8 µm, e.g., it may be 3 µm, 5 µm, 7 µm etc.

Referring to FIG. 8, the opening area 12 comprises a first edge 121 and a second edge 122. Preferably, the convexes on the first edge 121 may be oppositely arranged in one-to-one correspondence with the convexes on the first edge 122.

Wherein, in the above embodiment, the distance B (i.e., the distance between the vertexes of two opposite convexes) between any two opposite convexes on the two edges of the opening area is 4 µm to 50 µm, for example, it may be 10 µm, 20 µm etc. Referring to Table 1, which shows the values of the line width L (unit: µm) of the black matrix formed under different values of the convex width A (unit: µm) and the distance B between any two opposite convexes on the two edges (unit: µm) when the height C of the convex is 1.5 µm and the light transmittance of the opening area of the mask plate is 100%.

TABLE 1

| B | A | | | | | |
|---|---|---|---|---|---|---|
|   | 0 | 3 | 4 | 5 | 6 | 7 |
| 40 | 40.8 | 41.9 | 42.0 | 42.1 | 42.1 | 42.0 |
| 35 | 35.8 | 36.9 | 37.1 | 37.1 | 37.2 | 37.1 |
| 30 | 30.9 | 31.9 | 32.1 | 32.0 | 32.1 | 32.1 |
| 25 | 25.9 | 26.9 | 27.1 | 27.1 | 27.2 | 27.1 |
| 20 | 20.9 | 21.9 | 22.1 | 22.1 | 22.1 | 22.1 |
| 15 | 15.9 | 17.0 | 17.2 | 17.2 | 17.2 | 17.1 |
| 14 | 14.8 | 15.9 | 16.1 | 16.1 | 16.2 | 16.1 |
| 13 | 13.9 | 14.9 | 15.0 | 15.1 | 15.1 | 15.1 |
| 12 | 13.1 | 14.0 | 14.1 | 14.2 | 14.2 | 14.1 |
| 11 | 12.3 | 13.1 | 13.3 | 13.3 | 13.3 | 13.3 |
| 10 | 11.6 | 12.4 | 12.5 | 12.5 | 12.6 | 12.5 |
| 9 | 10.8 | 11.6 | 11.8 | 11.8 | 11.8 | 11.8 |
| 8 | 9.9 | 10.8 | 11.0 | 11.0 | 11.1 | 10.9 |
| 7 | 8.8 | 10.0 | 10.1 | 10.2 | 10.1 | 10.1 |
| 6 | 7.0 | 8.9 | 9.0 | 9.1 | 9.0 | 9.0 |
| 5 | — | 7.0 | 7.4 | 7.5 | 7.4 | 7.5 |
| 4 | — | — | — | — | — | — |

The mask plate provided by an embodiment of the present invention may be used for a negative photoresist or a positive photoresist, by setting the edge of the opening area of the mask plate to be in a concave-convex shape, the linearity of the matrix edge formed after the processes of coating, exposing, developing and roasting of the photoresist can be improved, so as to prevent the problem of generating a jagged or a wavy shape at the matrix edge of a color filter in a color film substrate, thereby improving uniformity of color display of a liquid crystal display. The effect is particularly significant for a product using a negative photoresist or with a relatively thin line width in the formed matrix.

In addition, an embodiment of the present invention further provides a method of patterning using the above mask plate, comprising:

forming a photoresist layer on a substrate;

exposing the photoresist layer using the mask plate of an embodiment of the present invention, and forming a photoresist matrix after development.

Wherein, the photoresist in the above photoresist layer may be a positive photoresist or a negative photoresist. Preferably, the photoresist in the photoresist layer is a negative photoresist.

The method of patterning using a mask plate provided by an embodiment of the present invention, by setting the edge of the opening area of the mask plate in a concave-convex shape, and in the process of patterning using the mask plate, can improve linearity of the matrix edge formed after the processes of coating, exposing, developing, roasting of the photoresist, so as to prevent the problem of generating a jagged or a wavy shape at the matrix edge of a color filter in a color film substrate, thereby improving uniformity of color display of a liquid crystal display. The effect is particularly significant for a product using a negative photoresist or with a relatively thin line width in the formed matrix.

The above embodiments are only used for explanations rather than limitations to the present invention, the ordinary skilled person in the related technical field, in the case of not departing from the spirit and scope of the present invention, may also make various modifications and variations, therefore, all the equivalent solutions also belong to the scope of the present invention, the patent protection scope of the present invention should be defined by the claims.

The invention claimed is:

1. A mask plate comprising a light shielding area and an opening area, wherein the edge of the opening area is in a concave-convex shape, and said mask plate is for exposing a photoresist layer.

2. The mask plate according to claim 1, wherein the concave-convex shape is a jagged or a wavy shape.

3. The mask plate according to claim 1, wherein the concave-convex shape is formed by a plurality of convexes, and the spacing between any two adjacent convexes on the same edge is the same.

4. The mask plate according to claim 3, wherein the plurality of convexes are isosceles triangles and have the same size.

5. The mask plate according to claim 4, wherein the vertex angle of the convex is 30~150°.

6. The mask plate according to claim 4, wherein the height of the convex is 1 μm to 2 μm, the width of the convex is 1 μm to 8 μm.

7. The mask plate according to claim 4, wherein the convexes on two edges of the opening area are oppositely arranged in one-to-one correspondence.

8. The mask plate according to claim 7, wherein the distance between any two opposite convexes on the two edges of the opening area is 4 μm to 50 μm.

9. A method of patterning using the mask plate for exposing said photoresist layer as claimed in claim 1, comprising:
    forming a photoresist layer on a substrate;
    exposing the photoresist layer using the mask plate, and forming a photoresist matrix after development.

10. The method according to claim 9, wherein the photoresist in the photoresist layer is a negative photoresist.

* * * * *